United States Patent
Cho et al.

(10) Patent No.: US 7,359,273 B2
(45) Date of Patent: Apr. 15, 2008

(54) SEMICONDUCTOR MEMORY DEVICE HAVING LAYOUT FOR MINIMIZING AREA OF SENSE AMPLIFIER REGION AND WORD LINE DRIVER REGION

(75) Inventors: Young Ok Cho, Sungnam-si (KR); Yeong Taek Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/594,278

(22) Filed: Nov. 8, 2006

(65) Prior Publication Data

US 2007/0147161 A1 Jun. 28, 2007

(30) Foreign Application Priority Data

Dec. 27, 2005 (KR) ........................ 10-2005-0130511

(51) Int. Cl.
*G11C 8/00* (2006.01)
(52) U.S. Cl. ..................... 365/230.03; 365/230.01; 365/230.06; 365/63
(58) Field of Classification Search ........... 365/230.03, 365/230.01, 230.06, 63
See application file for complete search history.

(56) References Cited

U.S. PATENT DOCUMENTS

| | | | | |
|---|---|---|---|---|
| 5,373,479 | A * | 12/1994 | Noda | 365/230.06 |
| 5,691,945 | A * | 11/1997 | Liou et al. | 365/200 |
| 5,848,006 | A * | 12/1998 | Nagata | 365/230.06 |
| 6,366,515 | B2 * | 4/2002 | Hidaka | 365/222 |
| 6,498,756 | B2 * | 12/2002 | Lee | 365/200 |
| 6,538,946 | B2 | 3/2003 | Arai et al. | 365/206 |
| 6,680,501 | B2 | 1/2004 | Ito et al. | 257/296 |
| 6,791,132 | B2 | 9/2004 | Nakai et al. | 257/296 |
| 2002/0093843 | A1 | 7/2002 | Nakai et al. | 365/63 |

FOREIGN PATENT DOCUMENTS

| | | |
|---|---|---|
| JP | 2002-217385 | 8/2002 |
| KR | 10-2002-0005465 | 1/2002 |
| KR | 10-2003-0009071 | 1/2003 |

* cited by examiner

*Primary Examiner*—Viet Q. Nguyen
(74) *Attorney, Agent, or Firm*—Mills & Onello LLP

(57) ABSTRACT

A semiconductor memory device has a layout that minimizes the area required for sense amplifier and word line driver regions. In the semiconductor memory device of the present invention, decoding drivers are arranged in sense amplifier regions. Further, the wiring for signals to be transmitted from decoding drivers to a corresponding sub-word line driver is arranged in adjacent sub-arrays. Accordingly, the area of word line regions can be remarkably reduced. Further, the wiring required to transmit pre-decoding signals that are provided to decoding drivers is also arranged in adjacent sub-arrays. Accordingly, the area of sense amplifier regions can be greatly reduced. Consequently, the semiconductor memory device of the present invention is advantageous in that the layout area thereof is notably reduced.

16 Claims, 12 Drawing Sheets

SEMICONDUCTOR MEMORY DEVICE HAVING LAYOUT FOR MINIMIZING AREA OF SENSE AMPLIFIER REGION AND WORD LINE DRIVER REGION

RELATED APPLICATIONS

This application claims priority to Korean Patent Application No. 10-2005-130511, filed on Dec. 27, 2005, in the Korean Intellectual Property Office, the contents of which are incorporated herein by reference in their entirety.

BACKGROUND OF THE INVENTION

1. Field of the Invention

The present invention relates, in general, to semiconductor memory devices and, more particularly, to a semiconductor memory device, which has a layout including sub-array regions, and bit line sense amplifier regions and word line driver regions that are adjacent to the sub-array regions.

2. Description of the Related Art

A semiconductor memory device includes a memory array, in which memory cells, that is, storage devices for storing data, are arranged in a matrix array of rows and columns. In this case, word lines WL are arranged in rows, and bit lines BL are arranged in columns. The memory cells MC are arranged at the intersections of word lines WL and bit lines BL.

As shown in FIG. 1, a memory array is divided into a plurality of sub-arrays S_ARR. Sense amplifier regions BK_SA are disposed between two sub-arrays S_ARR that are adjacent to each other in the direction of bit lines BL. Further, word line driver regions BK_SWD are disposed between two sub-arrays S_ARR that are adjacent to each other in the direction of word lines WL. Further, junction regions JNC are disposed at the intersections of the sense amplifier regions BK_SA and the word line driver regions BK_SWD.

Meanwhile, in the semiconductor memory device, high integration is one among a number of very significant technical concerns. In order to more highly integrate a semiconductor memory device, technology for reducing the area of the sense amplifier regions BK_SA and the word line driver regions BK_SWD and efficiently arranging the sense amplifier regions BK_SA and the word line driver regions BK_SWD, as well as technology for reducing the area of the memory array, is an important issue.

Recently, vertical MOS transistors, such as pillar-shaped transistors, have been developed. Because of the development of such vertical MOS transistors, the area required for transistors can be greatly reduced. Therefore, the area of memory cells and the area of a memory array can also be remarkably reduced. As a result, a reduction in the area of the sense amplifier regions BK_SA and the word line driver regions BK_SWD has also become an important issue.

FIG. 2 is a layout diagram showing the arrangement of circuits in a conventional semiconductor memory device. In FIG. 2, for clarity of understanding, sense amplifier regions, word line driver regions and junction regions are exaggerated in size relative to actual sizes thereof. Referring to FIG. 2, in each sense amplifier region BK_SA, bit line sense amplifiers BLSAs are arranged for sensing and amplifying data on a bit line BL. In each word line driver region BK_SWD, sub-word line drivers SWDs for driving word lines WL are arranged.

Further, in each junction region JNC, decoding drivers PXD<i> (i=0 to 3), designated as "PX drivers", are arranged.

Further, the entire wiring required to transmit pre-decoding signals PX<i> (i=0 to 3) to the decoding drivers PXD<i> is arranged to pass through the sense amplifier regions BK_SA. Further, the wiring required to transmit delayed decoding signals PX<i>D and inverted decoding signals PX<i>B, provided by the decoding drivers PXD<i>, is arranged to pass through the word line driver regions BK_SWD.

Further, in the junction region JNC of FIG. 2, first and second equalization drivers EQL_DR and EQR_DR, a pull-up voltage driver LAD, a pull-down voltage driver LABD, etc., are arranged. The first and second equalization drivers EQL_DR and EQR_DR generate first and second equalization signals EQL and EQR, respectively, for equalizing left and right bit lines BL connected to a corresponding bit line sense amplifier BLSA. The pull-up voltage driver LAD and the pull-down voltage driver LABD generate a pull-up driving signal LA and a pull-down driving signal LAB, respectively, for driving the pull-up sensing and pull-down sensing of the bit line sense amplifier BLSA.

Further, the entire wiring required to transmit the first and second equalization signals EQL and EQR, the pull-up driving signal LA, and the pull-down driving signal LAB, is arranged to pass through the sense amplifier regions BK_SA. In addition, the wiring required to transmit first and second connection control signals ISOR and ISOL for driving the bit line sense amplifiers BLSA, and a column select signal CSL is arranged to pass through the sense amplifier regions BK_SA.

Further, the wiring required to transmit power, such as a supply voltage VCC, a ground voltage VSS and a boosted voltage VPP, is arranged to pass through the sense amplifier regions BK_SA and the word line driver regions BK_SWD.

In this case, if transistors constituting the bit line sense amplifiers BLSA and the sub-word line drivers SWD are implemented using vertical MOS transistors, the area required for such transistors can be remarkably reduced. Therefore, the area required to implement the bit line sense amplifiers BLSA and the sub-word line drivers SWD is remarkably reduced (as shown in the parts of FIG. 3 indicated by oblique lines).

However, in the conventional semiconductor memory device, since the wiring required to transmit signals and/or voltages is arranged to pass through the sense amplifier regions BK_SA and the word line driver regions BK_SWD, possible reduction in the widths of the sense amplifier region BK_SA and the word line driver region BK_SWD (refer to w1 and w2 of FIGS. 2 and 3) is greatly restricted.

In particular, since the decoding drivers PXD<i> (i=0 to 3) are arranged in the junction region JNC, the wiring required to transmit a large number of pre-decoding signals PX<i> (i=0 to 3) and the wiring required to transmit the delayed decoding signals PX<i>D (i=0 to 3) and the inverted decoding signals PX<i>B (i=0 to 3) are arranged to pass through the sense amplifier regions BK_SA and the word line driver regions BK_SWD. Accordingly, it is very difficult to reduce the widths of the sense amplifier regions BK_SA and the word line driver regions BK_SWD.

SUMMARY OF THE INVENTION

Accordingly, an object of the present invention to provide a semiconductor memory device, in which the widths of sense amplifier regions and word line driver regions can be reduced, thus consequently reducing the overall layout area.

In one aspect, the present invention is directed to a semiconductor memory device. The semiconductor memory device of the present invention comprises a plurality of sub-arrays, each including a plurality of memory cells; a plurality of sense amplifier regions, each disposed between two sub-arrays that are adjacent to each other in a direction of bit lines of the memory cells, wherein, in each of the sense amplifier regions, a plurality of bit line sense amplifiers for sensing and amplifying data on a pair of bit lines of a corresponding sub-array is arranged; and a plurality of word line driver regions, each disposed between two sub-arrays that are adjacent to each other in a direction of word lines of the memory cells, wherein, in each of the word line driver regions, a plurality of sub-word line drivers operated to drive a word line specified by a predetermined word line enable signal and a delayed decoding signal and an inverted decoding signal, which form a pair, is arranged. The word line enable signal specifies a word line group composed of a plurality of word lines, and the pair of decoding signals specifies a single word line from the specified word line group. Further, decoding drivers for generating the delayed decoding signal and the inverted decoding signal in response to corresponding pre-decoding signals are arranged in the sense amplifier regions.

In one embodiment, the memory cells and the bit line sense amplifiers include vertical MOS transistors.

In another embodiment, the sub-word line drivers include vertical MOS transistors.

In another embodiment, the decoding drivers include vertical MOS transistors.

In another embodiment, wiring required to transmit the delayed decoding signal and the inverted decoding signal from the decoding drivers to a corresponding sub-word line driver is arranged to pass through the sub-arrays.

In another embodiment, wiring required to provide the pre-decoding signals to the decoding drivers is arranged to pass through the sub-arrays.

In another embodiment, each word line group is composed of eight word lines.

In another embodiment, a pull-up voltage driver, for providing a pull-up voltage to the bit line sense amplifiers, and a pull-down voltage driver, for providing a pull-down voltage to the sense amplifiers, are arranged in the sense amplifier regions.

In another embodiment, the pull-up voltage driver and the pull-down voltage driver include vertical MOS transistors.

In another aspect, the present invention is directed to a semiconductor memory device, comprising: a plurality of sub-arrays, each including a plurality of memory cells; a plurality of sense amplifier regions, each disposed between two sub-arrays that are adjacent to each other in a direction of bit lines of the memory cells, wherein, in each of the sense amplifier regions, a plurality of bit line sense amplifiers for sensing and amplifying data on a pair of bit lines of a corresponding sub-array is arranged; and a plurality of word line driver regions, each disposed between two sub-arrays that are adjacent to each other in a direction of word lines of the memory cells, wherein, in each of the word line driver regions, a plurality of sub-word line drivers operated to drive a word line specified by a word line enable signal and a delayed decoding signal and an inverted decoding signal, which form a pair, is arranged, the word line enable signal specifying a word line group composed of a plurality of word lines, and the pair of decoding signals specifying a single word line from the specified word line group. Delayed decoding drivers and inverted decoding drivers for generating the delayed decoding signal and the inverted decoding signal, respectively, in response to corresponding pre-decoding signals, are arranged in the sense amplifier regions.

In one embodiment, the memory cells and the bit line sense amplifiers include vertical MOS transistors.

In another embodiment, the sub-word line drivers include vertical MOS transistors.

In another embodiment, the delayed decoding drivers and the inverted decoding drivers include vertical MOS transistors.

In another embodiment, the delayed decoding drivers and the inverted decoding drivers are arranged in different sense amplifier regions.

In another embodiment, wiring required to transmit the delayed decoding signal and the inverted decoding signal from the decoding drivers to a corresponding sub-word line driver is arranged to pass through different sub-arrays.

In another embodiment, wiring required to provide the pre-decoding signals to the delayed decoding drivers and the inverted decoding drivers is arranged to pass through the sub-arrays.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

Prior to describing a semiconductor memory device according to the present invention, MOS transistors suitable for implementing respective components of the present invention are now described.

Figure 4A:
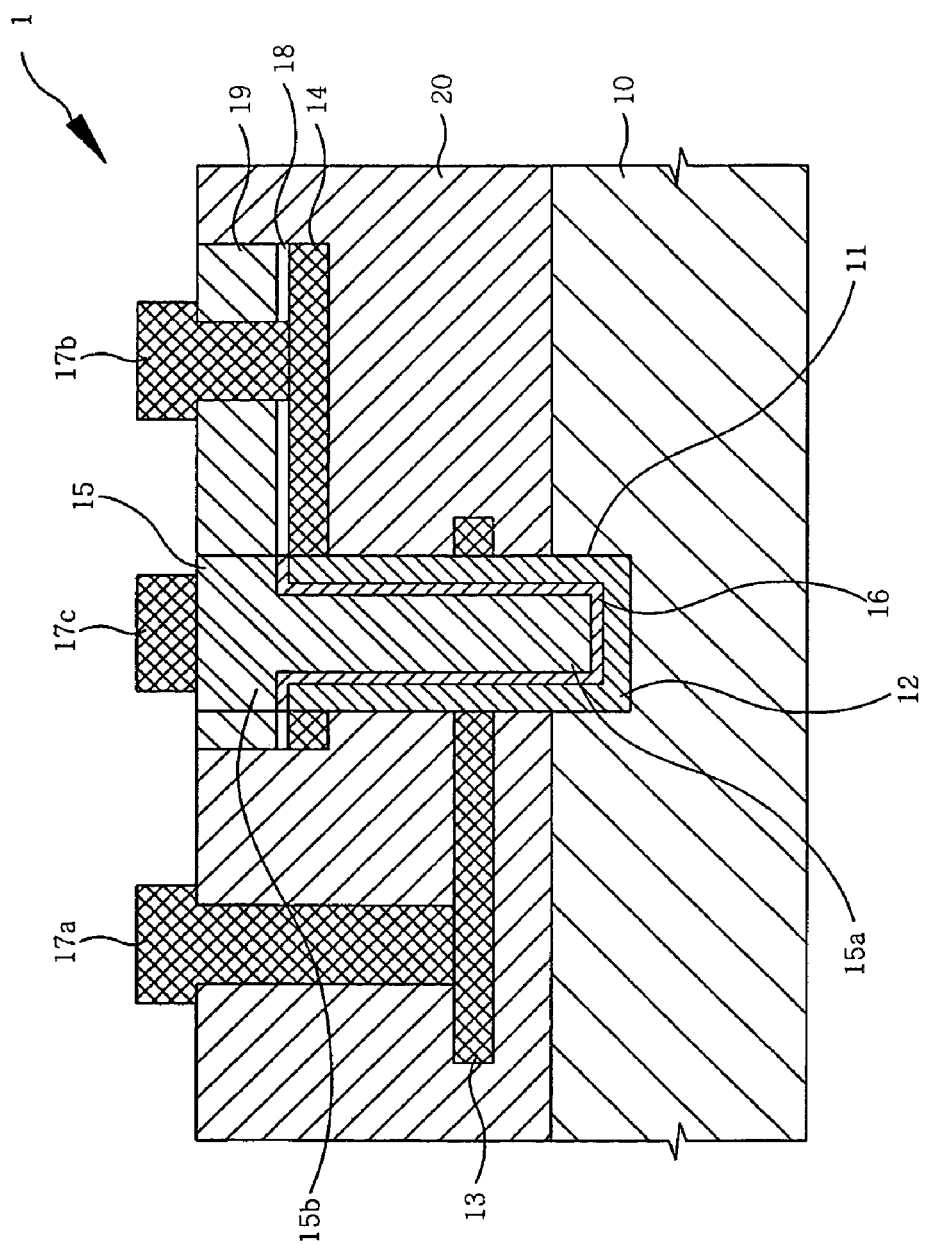
FIGS. 4A and 4B are a sectional view and a perspective view, respectively, of a pillar-shaped vertical MOS transistor as an example of a vertical MOS transistor applicable to a semiconductor memory device according to the present invention.
Figure 4B:
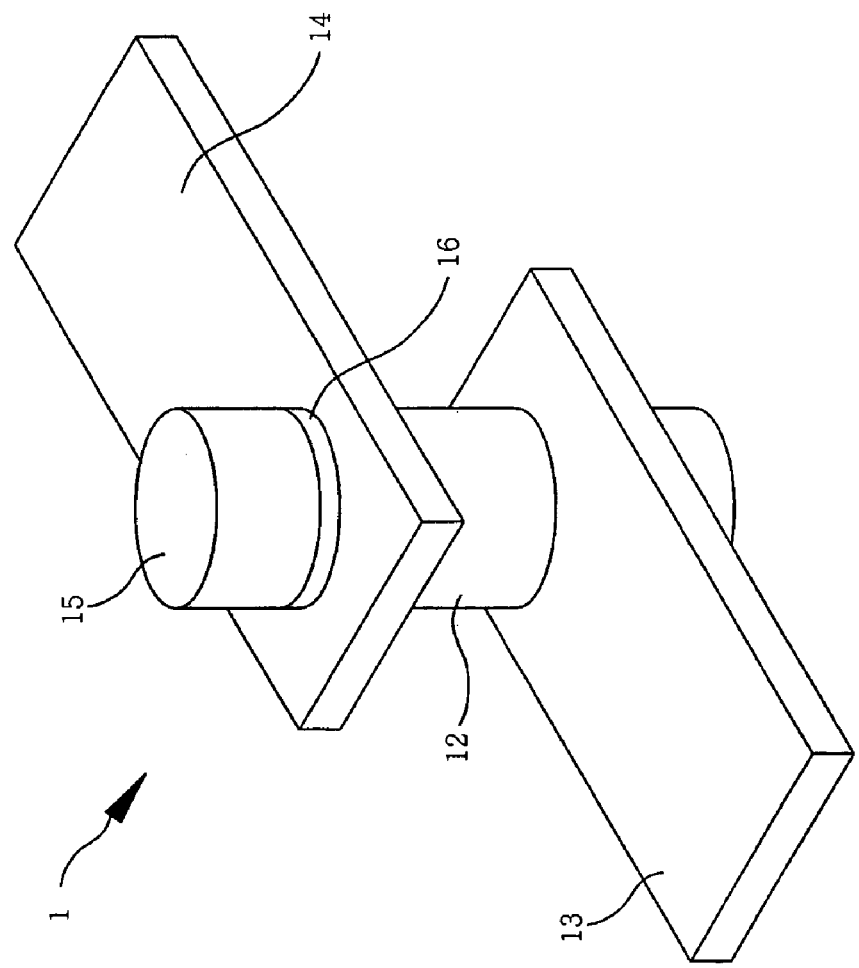

FIGS. 4A and 4B are a sectional view and a perspective view, respectively, of a pillar-shaped vertical MOS transistor as an example of a vertical MOS transistor applicable to a semiconductor memory device according to the present invention. Referring to FIGS. 4A and 4B, a gate structure 11 extends from a semiconductor substrate 10 in a vertical direction. Therefore, a MOS transistor having the gate structure 11 extending in a vertical direction is designated as a "vertical MOS transistor" in the present specification.

The vertical MOS transistor 1 includes a channel pattern 12 adjacent to the external surface of the gate structure 11 to surround the gate structure 11, a first conductive pattern 13 extending from the lower portion of the channel pattern 12 in a first horizontal direction, and a second conductive pattern 14 extending from the upper portion of the channel pattern 12 in a second horizontal direction.

The first or second conductive pattern 13 or 14 functions as a source or a drain, and is formed to surround the channel pattern 12.

The gate structure 11 includes a gate electrode 15, having a pillar shape with a circular section and made of a conductive material, and a gate dielectric film 16, formed on the external surface of the gate electrode 15. The channel pattern 12 is formed in a cylindrical shape having an internal diameter corresponding to the external diameter of the gate dielectric film 16 and having an open top portion, and is formed on the external surface of the gate dielectric film 16. Furthermore, the channel pattern 12 has an internal surface adjacent to the external surface of the gate dielectric film 16, and has an external surface adjacent to the first conductive pattern 13 and the second conductive pattern 14.

In detail, the gate electrode 15 includes a first pillar 15a having a first diameter and constituting the lower part of the gate electrode 15, and a second pillar 15b having a second diameter greater than the first diameter and constituting the upper part of the gate electrode 15. The channel pattern 12 has an external diameter identical to the second diameter, and is formed to surround the first pillar 15a. Further, the gate dielectric film 16 is formed between the first pillar 15a and the channel pattern 12.

The channel region of the MOS transistor 1 is formed in a part of the channel pattern 12 disposed between the first conductive pattern 13 and the second conductive pattern 14, and has a circular tube shape and an annular pillar shape. Therefore, the channel length of the MOS transistor 1 can be determined depending on the distance between the first and second conductive patterns 13 and 14. Meanwhile, the channel width of the MOS transistor 1 can be determined depending on the first diameter of the gate electrode 15.

Therefore, since the channel length and width can be suitably controlled, punch through or channel carrier mobility, caused by short channel effects, can be improved, and a threshold voltage, caused by narrow channel effects, can be decreased.

In this way, since short channel effects and narrow channel effects can be efficiently suppressed, the operation efficiency of the MOS transistor can be improved. Further, since the angle between the directions of extension of the first conductive pattern 13 and the second conductive pattern 14 can be variously adjusted, the layout of the semiconductor memory device, including the MOS transistor, can be notably improved.

For reference, in FIG. 4A, reference numerals 17a, 17b and 17c denote metallic wires connected to the first conductive pattern 13, the second conductive pattern 14 and the gate electrode 15, respectively. Reference numerals 18, 19 and 20 denote an oxide film, a capping film, and an interlayer dielectric film, respectively.

Hereinafter, the present invention is described in detail by describing the preferred embodiments of the present invention with reference to the attached drawings.

Figure 5:
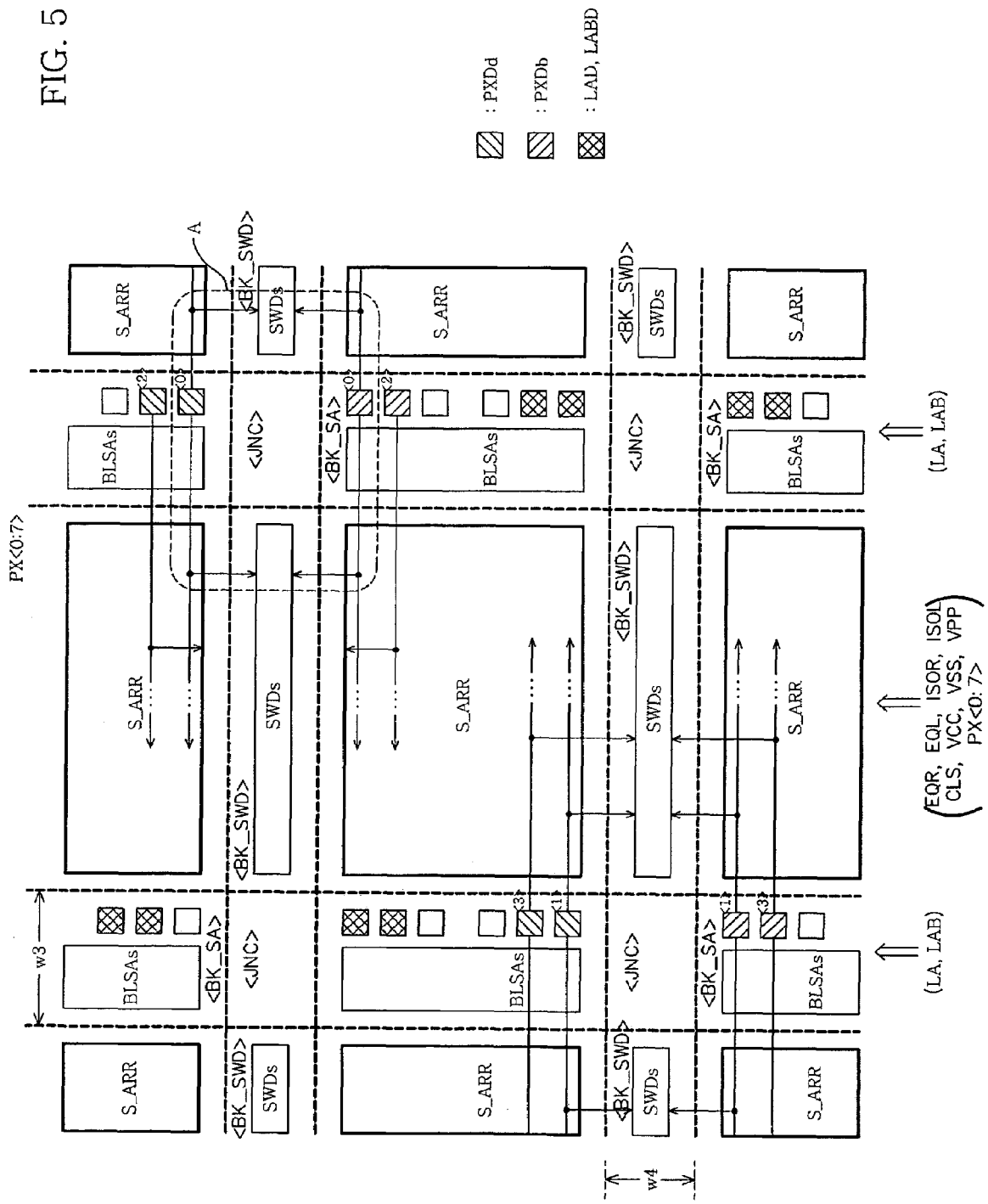
FIG. 5 is a layout diagram of a semiconductor memory device according to an embodiment of the present invention.
Figure 6:
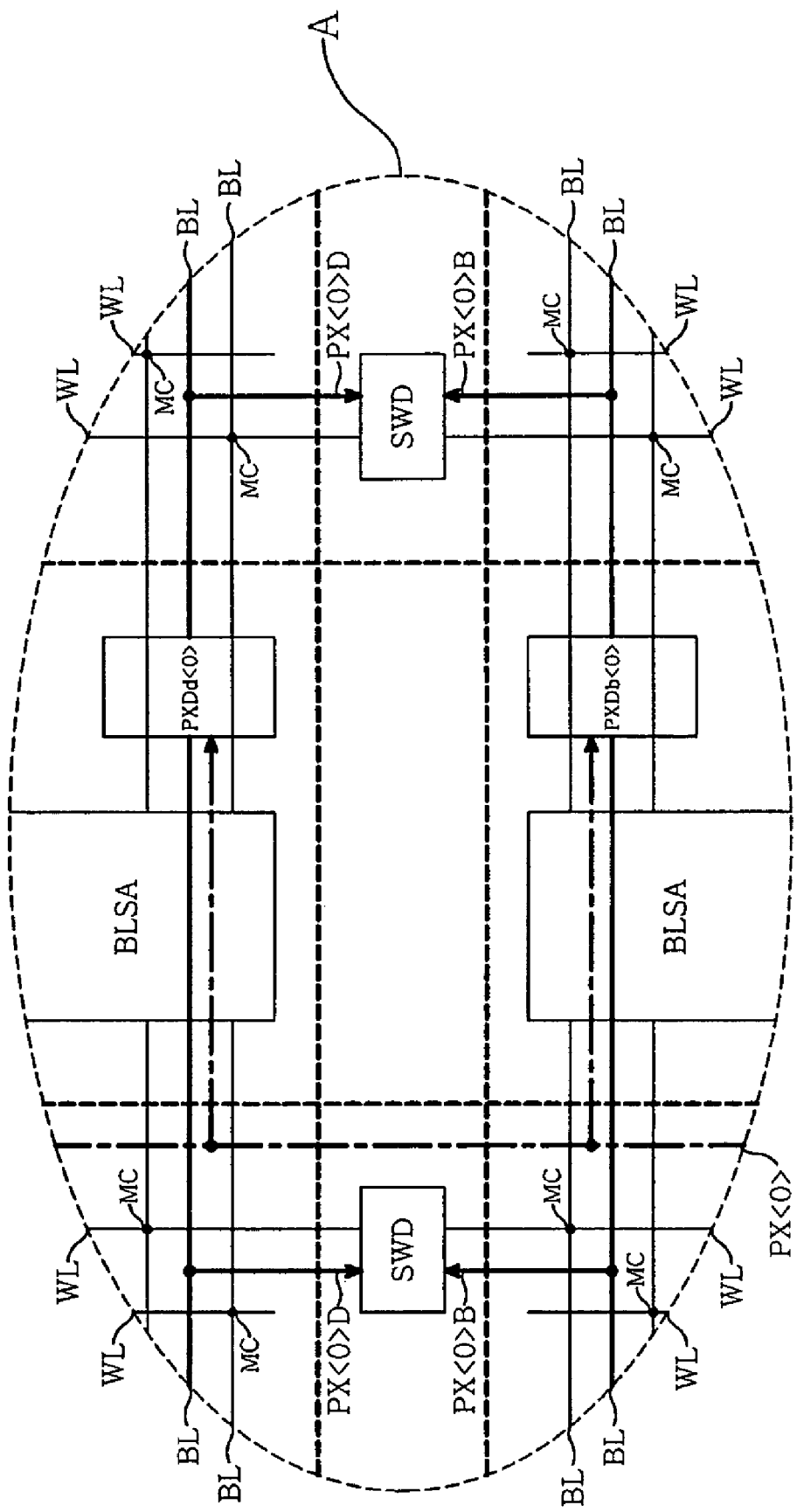
FIG. 6 is a diagram showing part A of FIG. 5 in detail.

FIG. 5 is a layout diagram of a semiconductor memory device according to an embodiment of the present invention. FIG. 6 is a diagram showing part A of FIG. 5 in detail. In FIGS. 5 and 6, for clarity of understanding, the length of each component is exaggerated relative to the actual length thereof. Further, in FIGS. 5 and 6, for clarity of understanding, the area occupied by sense amplifier regions, word line driver regions and junction regions are exaggerated relative to the actual areas thereof.

Referring to FIGS. 5 and 6, the semiconductor memory device of the present invention includes a plurality of sub-arrays S_ARR, a plurality of sense amplifier regions BK_SA, and a plurality of word line driver regions BK_SWD.

Each of the sub-arrays S_ARR includes a plurality of word lines WL, a plurality of bit lines BL and /BL, and a plurality of memory cells MC. Two adjacent bit lines BL and /BL form a bit line pair. Further, the memory cells MC are arranged at the intersections of the word lines WL and the bit line pairs BL and /BL.

Each of the sense amplifier regions BK_SA is disposed between two sub-arrays that are adjacent to each other in the direction of bit lines BL. In the sense amplifier region BK_SA, bit line sense amplifiers BLSAs are arranged. Each of the bit line sense amplifiers BLSAs senses and amplifies data on the bit line pair BL and /BL of a corresponding sub-array S_ARR. That is, the bit line sense amplifier BLSA senses and amplifies the data stored in a selected memory cell MC.

Figure 7:
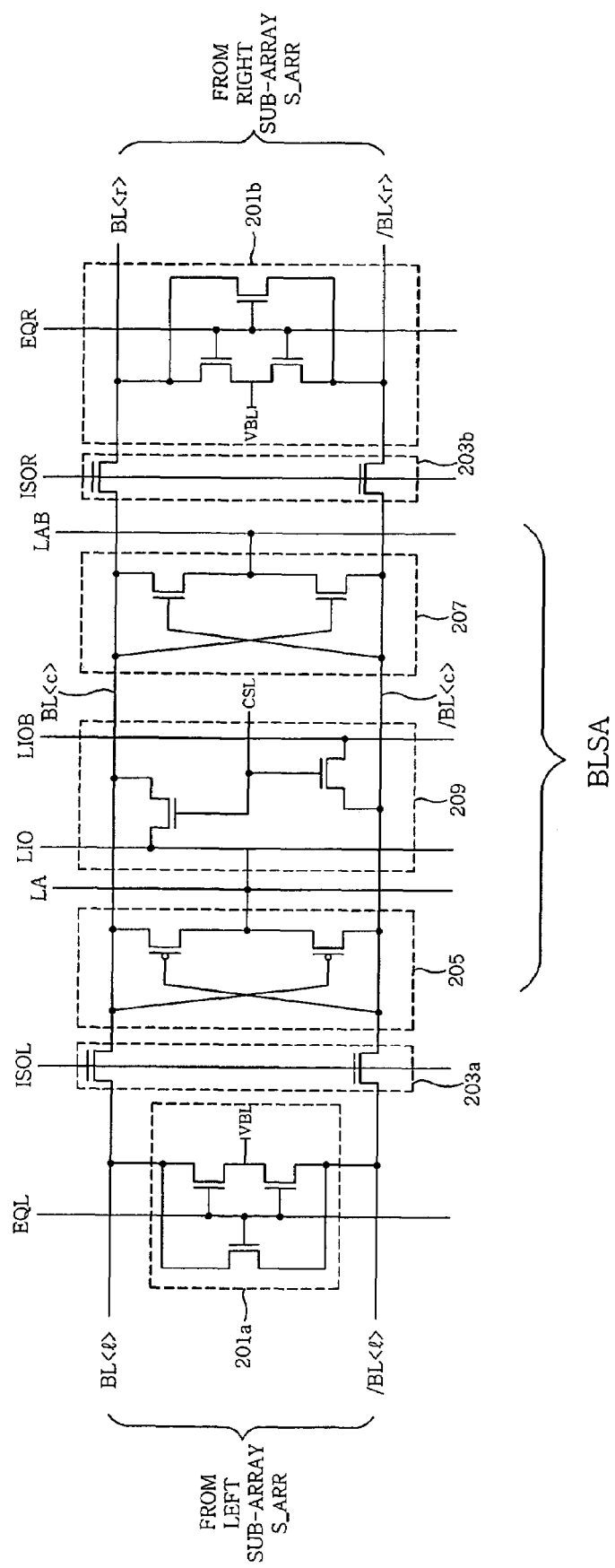
FIG. 7 is a circuit diagram of examples of the bit line sense amplifier of FIG. 5 and devices related thereto, which shows signals provided to the bit line sense amplifier.

FIG. 7 is a circuit diagram of examples of the bit line sense amplifier BLSA of FIG. 5 and devices related thereto, which shows signals provided to the bit line sense amplifier BLSA.

The bit line sense amplifier BLSA, shown in FIG. 7, senses and amplifies data on the bit line pairs BL and /BL of left and right sub-arrays S_ARR. In FIG. 7, for convenience of description, reference characters BL<l> and /BL<l> are used for the bit line pair of the left sub-array S_ARR. Further, reference characters BL<r> and /BL<r> are used for the bit line pair of the right sub-array S_ARR.

A first equalization unit 201a equalizes the bit line pair BL<l> and /BL<l> of the left sub-array S_ARR to a precharge voltage VBL in response to a first equalization signal EQL. A second equalization unit 201b equalizes the bit line pair BL<r> and /BL<r> of the right sub-array S_ARR to the precharge voltage VBL in response to a second equalization signal EQR.

A first connection unit 203a connects the bit line pair BL<l> and /BL<l> of the left sub-array S_ARR to a common bit line pair BL<c> and /BL<c> in response to a first connection control signal ISOL. A second connection unit 203b connects the bit line pair BL<r> and /BL<r> of the right sub-array S_ARR to the common bit line pair BL<c> and /BL<c> in response to a second connection control signal ISOR.

A pull-up driving unit 205 provides a pull-up voltage to the common bit line pair BL<c> and /BL<c> during the sensing operation of the bit line sense amplifier BLSA. In this case, the pull-up voltage of the pull-up driving unit 205 is provided through a pull-up driving signal LA.

A pull-down driving unit 207 provides a pull-down voltage to the common bit line pair BL<c> and /BL<c> during the sensing operation of the bit line sense amplifier BLSA. In this case, the pull-down voltage of the pull-down driving unit 207 is provided through a pull-down driving signal LAB.

A switching unit 209 connects the common bit line pair BL<c> and /BL<c> to a local data line pair LIO and LIOB in response to a column select signal CSL.

As shown in FIG. 7, it can be seen that a relatively large number of signals and voltages are provided to the bit line sense amplifier BLSA.

The bit line sense amplifier BLSA and devices related thereto are preferably implemented to include vertical MOS transistors. In this case, the layout area for the bit line sense amplifier BLSA and devices related thereto can be remarkably reduced. Further, when the bit line sense amplifier BLSA and devices related thereto are implemented to include pillar-shaped vertical MOS transistors, the wiring required to transmit respective signals can be easily performed.

Referring to FIGS. 5 and 6, each of the word line driver regions BK_SWD is disposed between two sub-arrays S_ARR that are adjacent to each other in the direction of word lines WL. In each word line driver region BK_SWD, sub-word line drivers SWDs are arranged.

Figure 8:
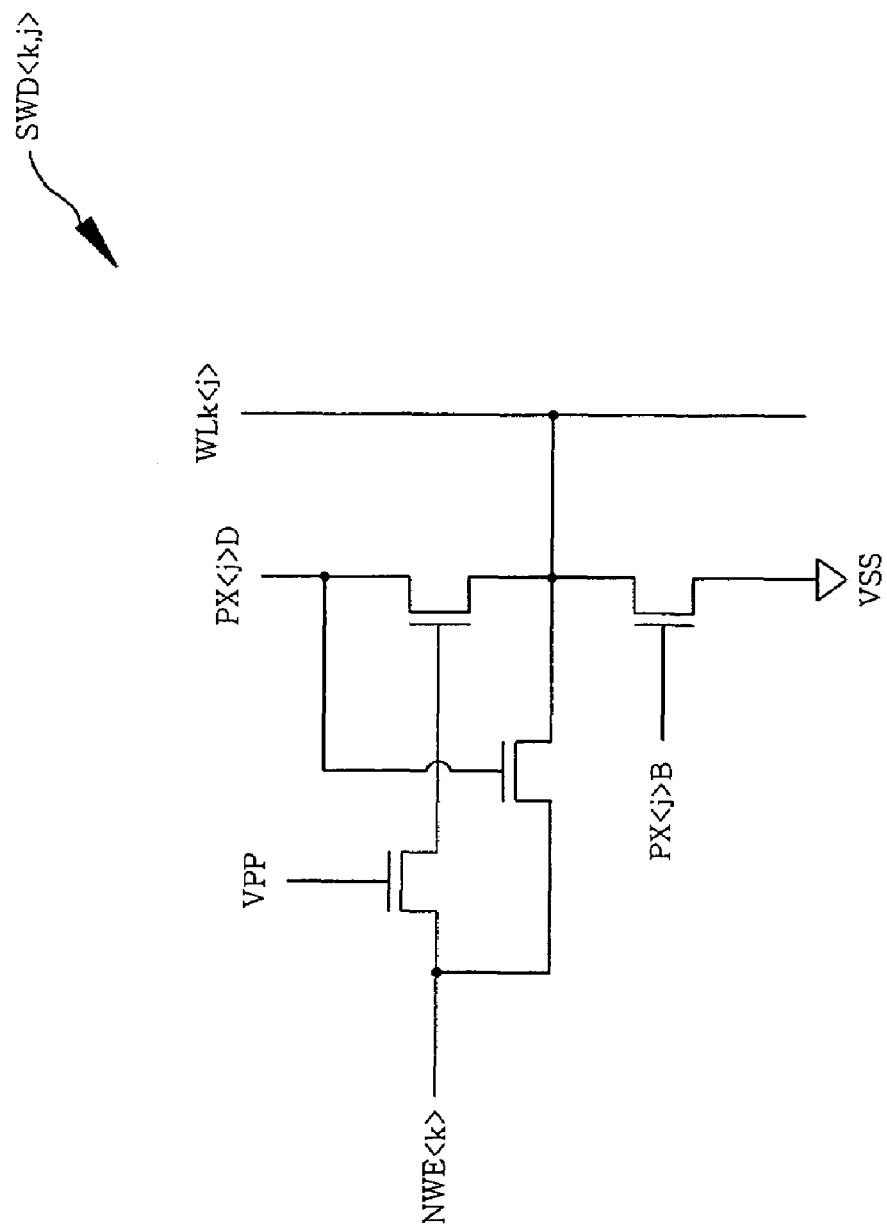
FIG. 8 is a circuit diagram of an example of the sub-word line driver of FIG. 5, which shows signals provided to the sub-word line driver.

FIG. 8 is a diagram of an example of the sub-word line driver SWD of FIG. 5, which shows signals provided to the sub-word line driver SWD. In FIG. 8, the indices of the reference character SWD are used to denote a sub-word line driver for driving a j-th word line in a k-th word line group.

For convenience of description, it is assumed that a sub-array S_ARR includes 1024 word lines WL. Then, 512 word lines WL are connected to each of word line driver regions BK_SWD arranged above and below a corresponding sub-array S_ARR. If a single word line group is composed of 8 word lines WL, a single sub-array S_ARR includes 64 word line groups. In this case, k is a natural number ranging from 1 to 64. Further, j is a natural number ranging from 1 to 8. In FIG. 5, for simplicity of illustration, the case where a single word line group includes 4 word lines WL is shown.

Referring to FIG. 8, a sub-word line driver SWD<k,j> is operated to drive a word line WL<k,j> specified by a word line enable signal NWE<k>, a delayed decoding signal PX<j>D and an inverted decoding signal PX<j>B.

In this case, the word line enable signal NWE<k> specifies a word line group composed of j word lines. Further, the delayed decoding signal PX<j>D and the inverted decoding signal PX<j>B specify a single word line from the specified word line group.

The sub-word line driver SWD is preferably implemented to include vertical MOS transistors.

Referring to FIGS. 5 and 6 again, in the semiconductor memory device of the present invention, delayed decoding drivers PXDd<j> and inverted decoding drivers PXDb<j> are also arranged in the sense amplifier regions BK_SA.

Figure 9A:
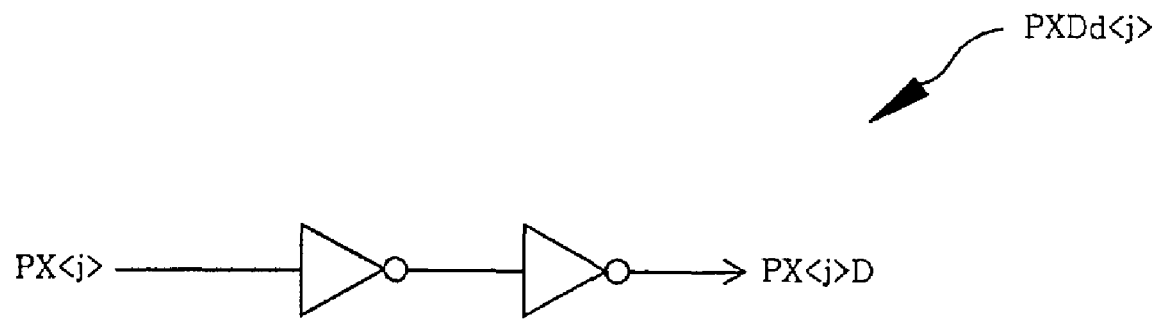
FIGS. 9A and 9B are diagrams showing examples of the delayed decoding driver and the inverted decoding driver of FIG. 5, respectively.
Figure 9B:
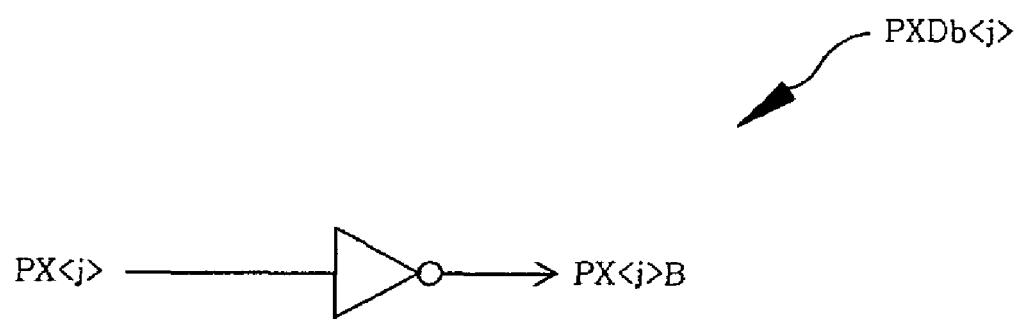

FIGS. 9A and 9B are diagrams showing examples of a delayed decoding driver PXDd<j> and an inverted decoding driver PXDb<j>. Referring to FIGS. 9A and 9B, the delayed decoding driver PXDd<j> delays a pre-decoding signal PX<j> and generates a delayed decoding signal PX<j>D. Further, the inverted decoding driver PXDb<j> inverts the pre-decoding signal PX<j> and generates an inverted decoding signal PX<j>B. In the present specification, the delayed decoding driver PXDd<j> and the inverted decoding driver PXDb<j> can be collectively designated as a "decoding driver".

In this case, the delayed decoding driver PXDd<j> and the inverted decoding driver PXDb<j> are preferably implemented to include vertical MOS transistors.

Referring to FIGS. 5 and 6, the delayed decoding signal PX<j>D and the inverted decoding signal PX<j>B, provided by the delayed decoding driver PXDd<j> and the inverted decoding driver PXDb<j>, respectively, are transmitted to a corresponding sub-word line driver SWD. The delayed decoding signal PX<j>D and the inverted decoding signal PX<j>B form a single decoding signal pair, which is provided to the same sub-word line driver SWD<k,j>.

Figure 1:
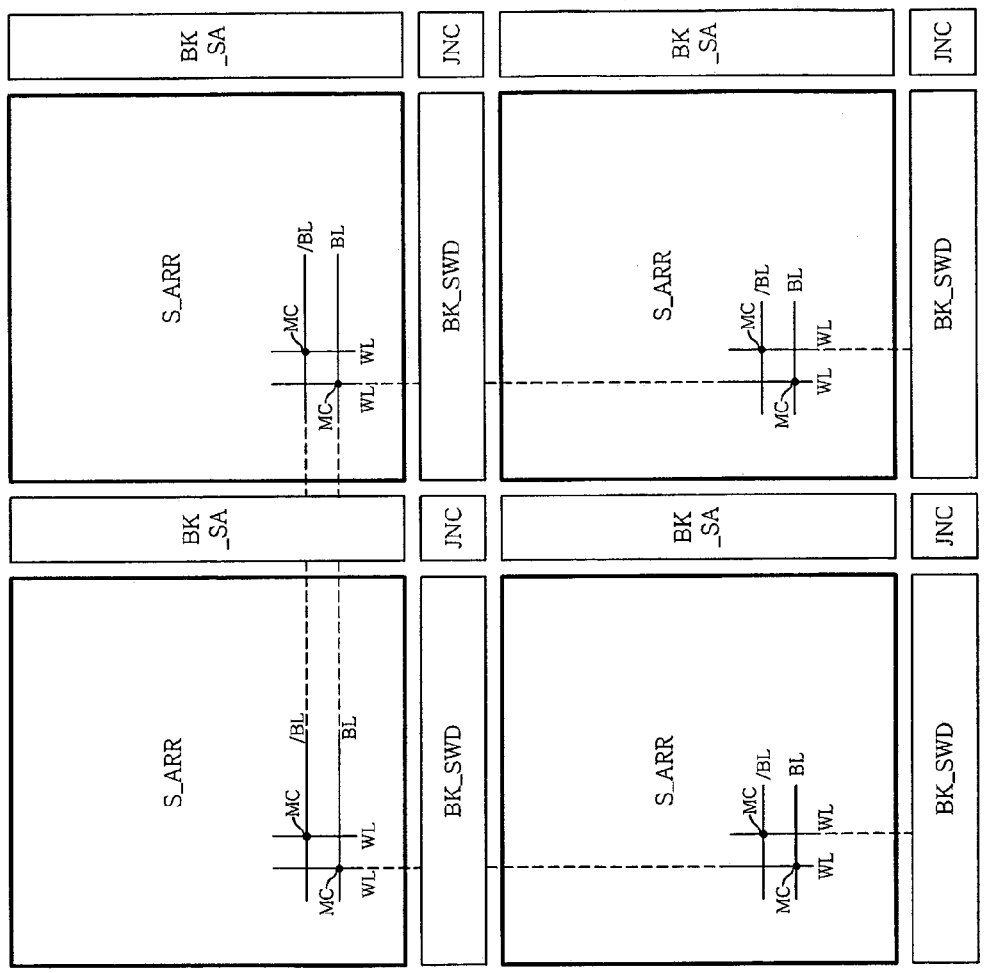
FIG. 1 is a layout diagram of a semiconductor memory device having a conventional sub-array structure.
Figure 2:
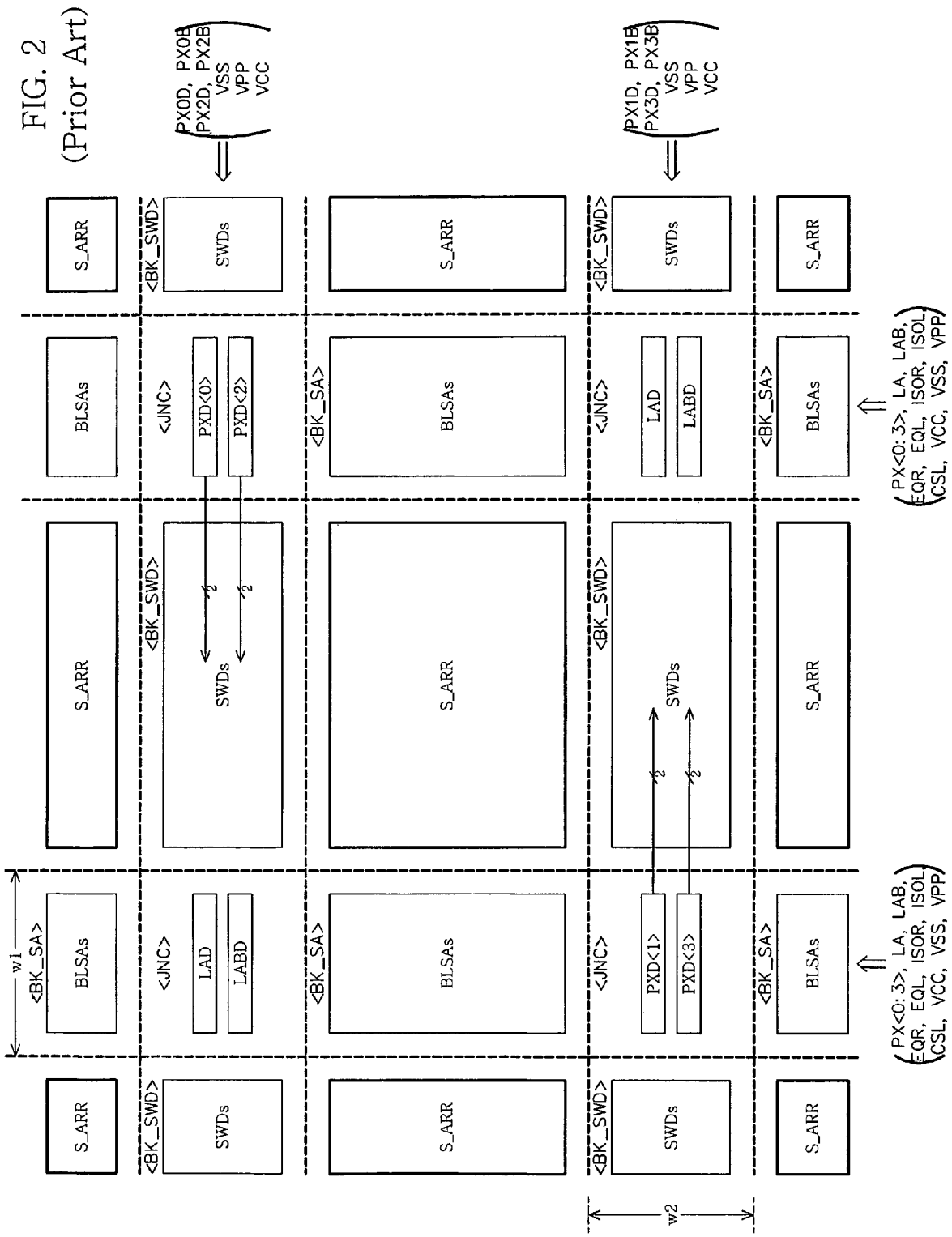
FIG. 2 is a layout diagram showing the arrangement of circuits in a conventional semiconductor memory device.
Figure 3:
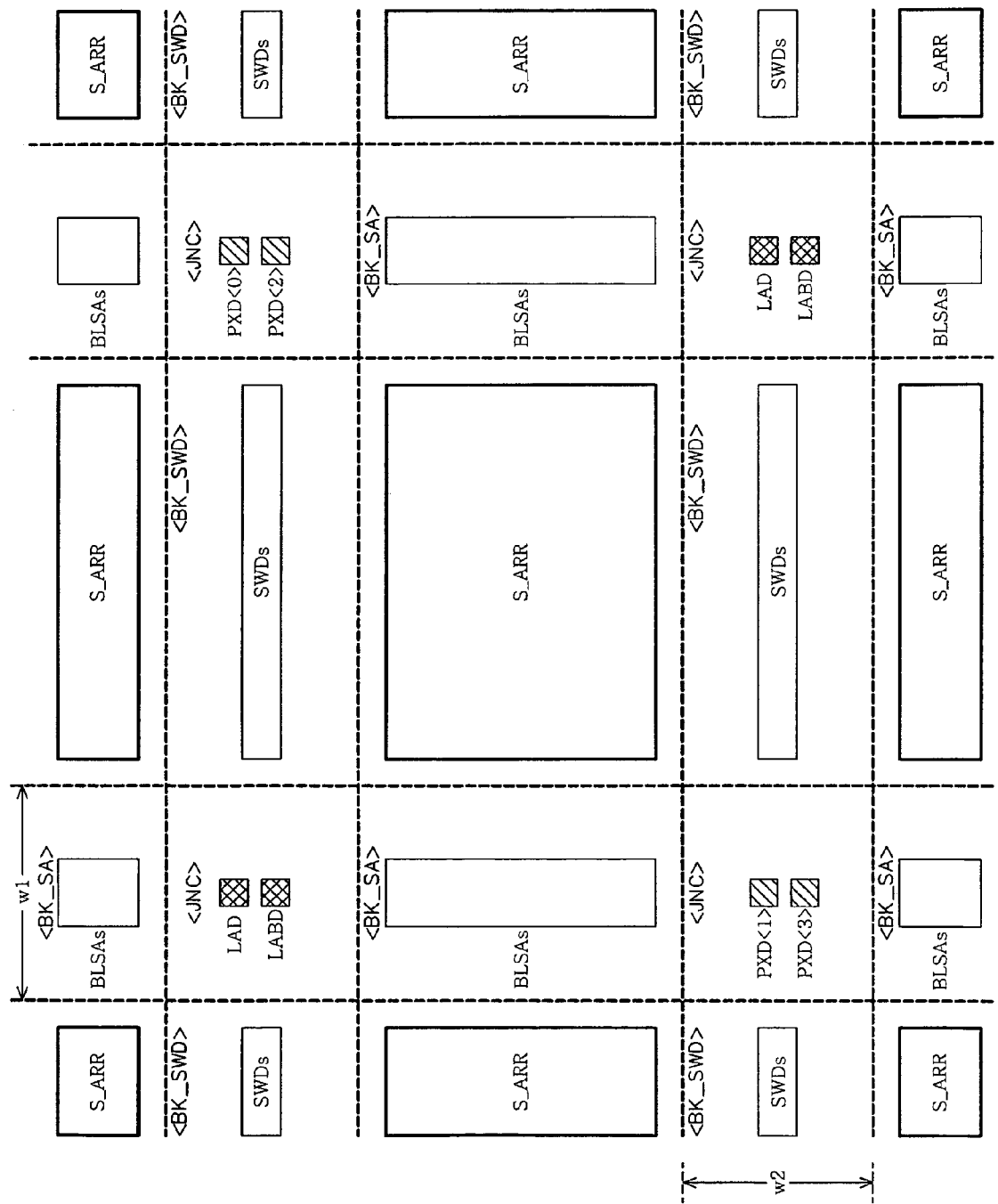
FIG. 3 is a diagram showing an example in which sense amplifier regions and word line driver regions are implemented using vertical MOS transistors in the semiconductor memory device of FIG. 2.

In this case, the wiring required to transmit the delayed decoding signal PX<j>D and the inverted decoding signal PX<j>B is arranged to pass through adjacent sub-arrays S_ARR. Accordingly, the width w4 of the sub-word line driver region BK_SWD is remarkably reduced compared to that of the conventional approach (that is, w4 of FIG. 5 is much smaller than w2 of FIGS. 2 and 3). Further, the overall layout area of the semiconductor memory device is greatly reduced by wiring the delayed decoding signal PX<j>D and the inverted decoding signal PX<j>B in this manner.

According to a preferred embodiment, the delayed decoding driver PXDd<j> and the inverted decoding driver PXDb<j>, corresponding to each other, are arranged in different sense amplifier regions BK_SA. In this case, the wiring required to transmit a signal pair, including the delayed decoding signal PX<j>D and the inverted decoding signal PX<j>B and provided to a sub-word line driver SWD, can be more easily arranged.

Figure 10:
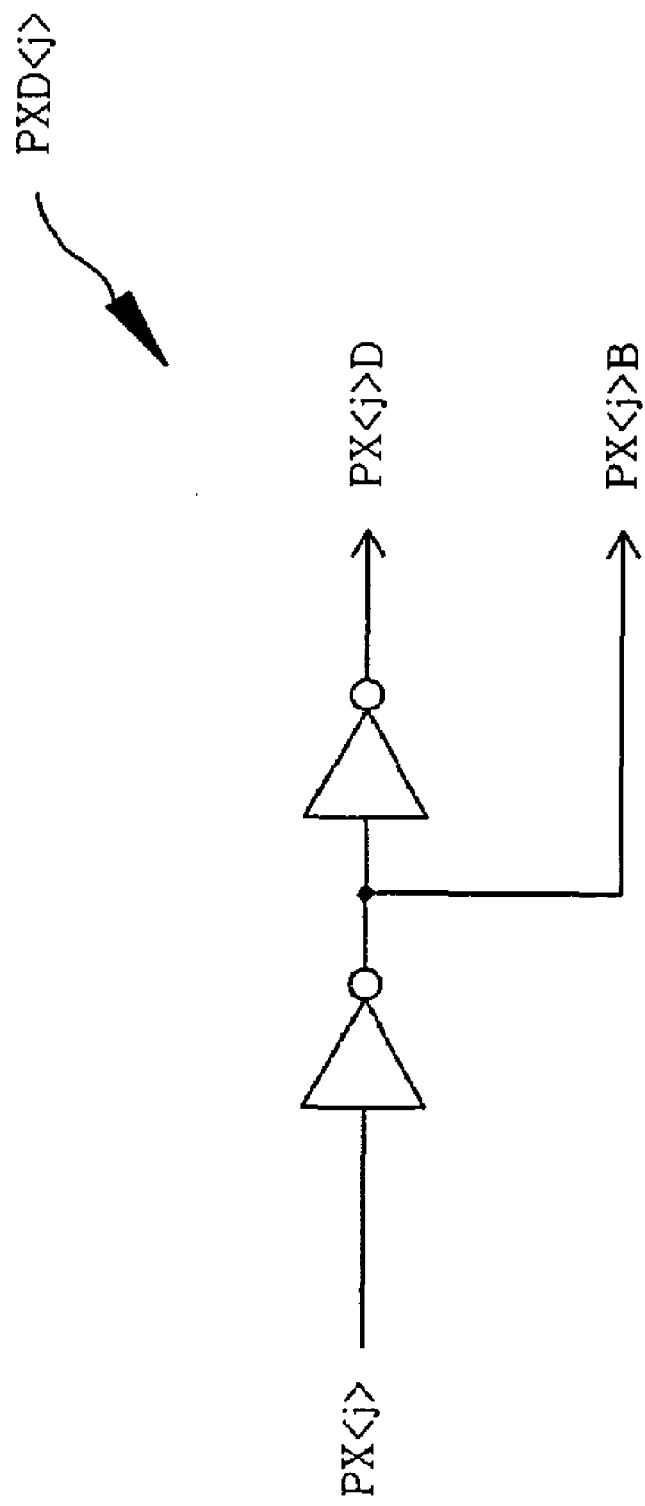
FIG. 10 is a diagram showing an example in which the delayed decoding driver and the inverted decoding driver of FIG. 5 are integrated into a single driver.

If the arrangement of wiring in this manner is permitted, the delayed decoding signal PX<j>D and the inverted decoding signal PX<j>B can also be provided by a decoding driver PXD<j>, as shown in FIG. 10. In this case, the wiring required to transmit the delayed decoding signal PX<j>D and the wiring required to transmit the inverted decoding signal PX<j>B pass through the same sub-array S_ARR.

Referring to FIGS. 5 and 6 again, the wiring required to transmit the pre-decoding signal PX<j> that is provided to the decoding drivers PXDd<j> and PXDb<j>, is preferably arranged to pass through the sub-arrays S_ARR. In this case, in the sense amplifier region BK_SA, the arrangement of the wiring required to transmit the pre-decoding signal PX<j> can be avoided, so that the width w3 of the sense amplifier region BK_SA is also greatly reduced compared to that of the prior art (that is, w3 of FIG. 5 is much smaller than w1 of FIGS. 2 and 3). Accordingly, the overall layout area of the semiconductor memory device is notably reduced.

Referring to FIGS. 5 and 6 again, in the sense amplifier region BK_SA, the pull-up voltage driver LAD and the pull-down voltage driver LABD are arranged.

Figure 11A:
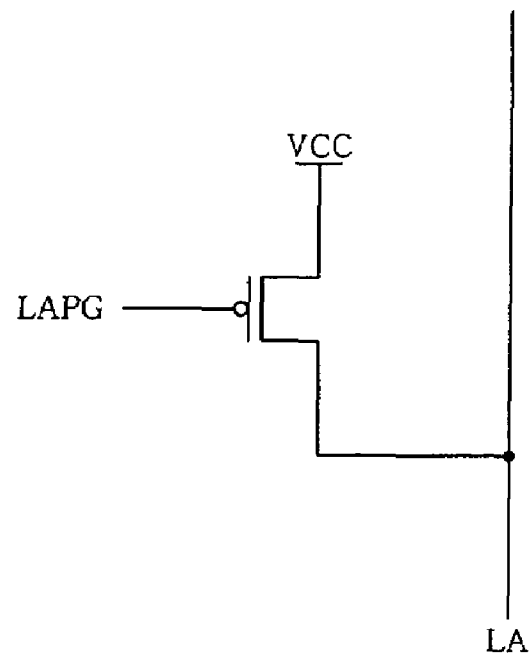
FIGS. 11A and 11B are diagrams showing examples of the pull-up voltage driver and the pull-down voltage driver of FIG. 5, respectively.
Figure 11B:
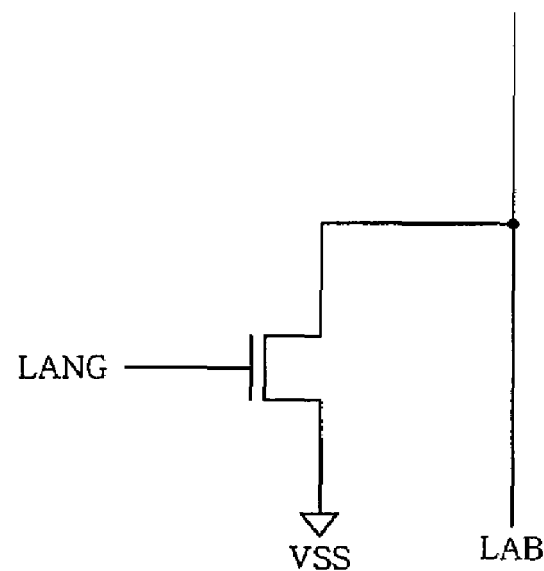

FIGS. 11A and 11B are diagrams showing examples of the pull-up voltage driver LAD and the pull-down voltage driver LABD of FIG. 5. Referring to FIG. 11A, the pull-up voltage driver LAD drives a pull-up driving signal LA to a supply voltage VCC in response to the activation of a pull-up control signal LAPG to a logic L state. Referring to FIG. 11B, the pull-down voltage driver LABD drives a pull-down driving signal LAB to a ground voltage VSS in response to the activation of a pull-down control signal LANG to a logic H state.

In this way, the pull-up voltage driver LAD and the pull-down voltage driver LABD are arranged in the sense amplifier region BK_SA, thus contributing to the reduction of the width w4 of the sub-word line driver region BK_SWD.

In this case, the pull-up voltage driver LAD and the pull-down voltage driver LABD are preferably implemented to include vertical MOS transistors.

Referring to FIG. 5 again, in the semiconductor memory device of the present invention, the wiring required to transmit the first and second equalization signals EQR and EQL, the first and second connection control signals ISOR and ISOL, the column select signal CSL, etc. is arranged to pass through the sub-arrays S_ARR.

Further, the wiring required to transmit the supply voltage VCC, the ground voltage VSS and the boosted voltage VPP is also arranged to pass through the sub-arrays S_ARR.

The wiring required to transmit signals and voltages is arranged to pass through the sub-arrays S_ARR in this way, thus further decreasing the width w3 of the sense amplifier region BK_SA.

In the semiconductor memory device of the present invention having the above construction, decoding drivers are arranged in sense amplifier regions. Further, the wiring required for signals that are transmitted from the decoding drivers to a sub-word line driver is arranged in adjacent sub-arrays. Accordingly, the area of the word line driver region can be greatly reduced.

Further, the wiring required to transmit pre-decoding signals that are provided to the decoding drivers is also arranged in adjacent sub-arrays. Accordingly, the area of the sense amplifier region can also be greatly reduced.

Consequently, the semiconductor memory device of the present invention is advantageous in that the overall layout area is notably decreased.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor memory device, comprising:
   a plurality of sub-arrays, each including a plurality of memory cells;
   a plurality of sense amplifier regions, each disposed between two sub-arrays that are adjacent to each other in a direction of bit lines of the memory cells, wherein, in each of the sense amplifier regions, a plurality of bit line sense amplifiers for sensing and amplifying data on a pair of bit lines of a corresponding sub-array is arranged; and
   a plurality of word line driver regions, each disposed between two sub-arrays that are adjacent to each other in a direction of word lines of the memory cells, wherein, in each of the word line driver regions, a plurality of sub-word line drivers operated to drive a word line specified by a word line enable signal and a delayed decoding signal and an inverted decoding signal, which form a pair, is arranged, the word line enable signal specifying a word line group composed of a plurality of word lines, and the pair of decoding signals specifying a single word line from the specified word line group,
   wherein decoding drivers for generating the delayed decoding signal and the inverted decoding signal in response to corresponding pre-decoding signals are arranged in the sense amplifier regions.

2. The semiconductor memory device according to claim 1, wherein the memory cells and the bit line sense amplifiers include vertical MOS transistors.

3. The semiconductor memory device according to claim 2, wherein the sub-word line drivers include vertical MOS transistors.

4. The semiconductor memory device according to claim 2, wherein the decoding drivers include vertical MOS transistors.

5. The semiconductor memory device according to claim 1, wherein wiring required to transmit the delayed decoding signal and the inverted decoding signal from the decoding drivers to a corresponding sub-word line driver is arranged to pass through the sub-arrays.

6. The semiconductor memory device according to claim 1, wherein wiring required to provide the pre-decoding signals to the decoding drivers is arranged to pass through the sub-arrays.

7. The semiconductor memory device according to claim 1, wherein each word line group is composed of eight word lines.

8. The semiconductor memory device according to claim 1, wherein a pull-up voltage driver, for providing a pull-up voltage to the bit line sense amplifiers, and a pull-down voltage driver, for providing a pull-down voltage to the sense amplifiers, are arranged in the sense amplifier regions.

9. The semiconductor memory device according to claim 8, wherein the pull-up voltage driver and the pull-down voltage driver include vertical MOS transistors.

10. A semiconductor memory device, comprising:
    a plurality of sub-arrays, each including a plurality of memory cells;
    a plurality of sense amplifier regions, each disposed between two sub-arrays that are adjacent to each other in a direction of bit lines of the memory cells, wherein, in each of the sense amplifier regions, a plurality of bit line sense amplifiers for sensing and amplifying data on a pair of bit lines of a corresponding sub-array is arranged; and
    a plurality of word line driver regions, each disposed between two sub-arrays that are adjacent to each other in a direction of word lines of the memory cells, wherein, in each of the word line driver regions, a plurality of sub-word line drivers operated to drive a word line specified by a word line enable signal and a delayed decoding signal and an inverted decoding signal, which form a pair, is arranged, the word line enable signal specifying a word line group composed of a plurality of word lines, and the pair of decoding signals specifying a single word line from the specified word line group,
    wherein delayed decoding drivers and inverted decoding drivers for generating the delayed decoding signal and the inverted decoding signal, respectively, in response to corresponding pre-decoding signals, are arranged in the sense amplifier regions.

11. The semiconductor memory device according to claim 10, wherein the memory cells and the bit line sense amplifiers include vertical MOS transistors.

12. The semiconductor memory device according to claim 11, wherein the sub-word line drivers include vertical MOS transistors.

13. The semiconductor memory device according to claim 11, wherein the delayed decoding drivers and the inverted decoding drivers include vertical MOS transistors.

14. The semiconductor memory device according to claim 10, wherein the delayed decoding drivers and the inverted decoding drivers are arranged in different sense amplifier regions.

15. The semiconductor memory device according to claim 14, wherein wiring required to transmit the delayed decoding signal and the inverted decoding signal from the decoding drivers to a corresponding sub-word line driver is arranged to pass through different sub-arrays.

16. The semiconductor memory device according to claim 10, wherein wiring required to provide the pre-decoding signals to the delayed decoding drivers and the inverted decoding drivers is arranged to pass through the sub-arrays.

* * * * *